US005691062A

United States Patent [19]
Shalaby et al.

[11] Patent Number: 5,691,062
[45] Date of Patent: Nov. 25, 1997

[54] MOLECULARLY BONDED INHERENTLY CONDUCTIVE POLYMERS ON SUBSTRATES AND SHAPED ARTICLES THEREOF

[75] Inventors: Shalaby W. Shalaby; Richard V. Gregory, both of Anderson, S.C.; Jacqueline M. Allan, Bowie, Md.

[73] Assignee: Clemson University, Clemson, S.C.

[21] Appl. No.: 390,066

[22] Filed: Feb. 16, 1995

[51] Int. Cl.$^6$ ........................................ B32B 9/04
[52] U.S. Cl. ................ 428/411.1; 428/419; 428/420; 428/457
[58] Field of Search ................... 428/419, 420, 428/457, 411.1, 913

[56] References Cited

U.S. PATENT DOCUMENTS

| | | | |
|---|---|---|---|
| 3,023,180 | 2/1962 | Canterino | 524/576 |
| 3,069,372 | 12/1962 | Schroeder | 524/274 |
| 3,097,194 | 7/1963 | Leonard | 525/340 |
| 3,220,989 | 11/1965 | Rolih | 525/333.3 |
| 3,278,464 | 10/1966 | Boyer | 521/137 |
| 4,189,369 | 2/1980 | Fang | 204/296 |
| 4,207,405 | 6/1980 | Masler | 525/327.4 |
| 4,500,684 | 2/1985 | Tucker | 525/327.3 |
| 4,581,415 | 4/1986 | Boyle | 525/332.2 |
| 4,678,840 | 7/1987 | Fong | 525/340 |
| 4,774,262 | 9/1988 | Blanquet | 521/31 |
| 4,814,423 | 3/1989 | Huang | 528/230 |
| 4,879,135 | 11/1989 | Greco | 623/1 |
| 4,966,934 | 10/1990 | Huang | 524/315 |
| 5,061,294 | 10/1991 | Harmer et al. | 51/295 |
| 5,225,495 | 7/1993 | Han et al. | 525/327.4 |

FOREIGN PATENT DOCUMENTS

| | | | |
|---|---|---|---|
| 7103583 | 1/1971 | Japan . | |
| 876045 | 8/1961 | United Kingdom | 525/342 |
| 907765 | 10/1962 | United Kingdom | 525/340 |

OTHER PUBLICATIONS

Alper, J., *Science*, 1989, vol. 246, pp. 208–210.
Baker, G.L., "Progress Toward Processable, Environmentally Stable Conducting Polymers," *Handbook of Conducting Polymers*, Terje A. Skotheim, ed., Marcel Dekker, Inc., NY, 1986, pp. 271–296.
Pfluger, P., et al., "Electronic Structure and Transport in the Organic 'Amorphous Semiconductor' Polypyrrole," *Handbook of Conducting Polymers*, 1986. pp. 1369–1381.
Street, G.B., "Polypyrrole from Powders to Plastics," *Handbook of Conducting Polymers*, 1986, pp. 265–291.
Friend, R.H., *Nature*, 1986, vol. 322, pp. 308–309.
Unsworth, J., et al., *J. of Intell. Mater. Syst. and Struct.*, 1992, vol. 3, pp. 380–395.
Emin, D., "Basic Issues of Electronic Transport in Insulating Polymers," *Handbook of Conducting Polymers*, 1986, pp. 915–936.
Fujitsuka, M., et al., *Synth. Met.*, 1992, vol. 53, pp. 1–10.
MacDiarmid, A.G., et al., *Mat. Res. Soc. Symp. Proc.*, 1990, vol. 173, p. 283–291.
Baum, R., *C&EN*, Apr. 19, 1993, pp. 36–37.

Focke, W.W., et al., *J. Phys. Chem.*, 1987, vol. 91. pp. 5813–5818.
Huang, W., et al., *J. Chem. Soc., Faraday Trans.* 1, 1986, vol. 82, pp. 2385–2400.
Pouget, J.P., et al., *Synth. Met.*, 1992, vol. 51, pp. 95–101.
McManus, P.M., et al., *J. Phys. Chem.*, 1987, vol. 91, pp. 744–747.
DeSurville, R., et al.,*Electrochimica Acta.*, 1968, vol. 13, pp. 1451–1458.
Kulkarni, V.G., "Intrinsically Conducting Polymers from Fundamental to Applied Research," *Intrinsically Conducting Polymers: An Emerging Technology*, M. Aldessi, ed., Kluwer Academic Publishers, Boston, 1993, pp. 45–50.
Chiang, J., et al., *Synth. Met.*, 1986, vol. 13, pp. 193–205.
MacDiarmid, A.G., et al., *Synth. Met.*, 1987, vol. 18, pp. 285–290.
Diaz, A.F., et al., *J. Electroanal. Chem.*, 1980, vol. 111, pp. 111–114.
Kobayashi, T., et al., *J. Electroanal. Chem.*, 1984, vol. 161, pp. 419–423.
Pouget, J.P., et al., *Macromolecules*, 1991, vol. 24, pp. 779–789.
MacDiarmid, A.G., et al., *Mol. Cryst. Liq. Cryst.*, 1985, vol. 121, pp. 173–180.
Teasdale, P.R., et al., *Analyst*, 1993, vol. 118, pp. 329–334.
Neoh, K.G., et al., *Polymer*, 1993, vol. 34, No. 8, pp. 1630–1636.
Kanazawa, K.K., et al., *Synth. Met.*, 1979, vol. 1, pp. 329–336.
Kanazawa, K.K., et al., *J.C.S. Chem. Comm.*,1979, pp. 854–855.
Diaz, A.F., et al., *J.C.S. Chem. Comm.*, 1979, pp. 635–636.
Mohilner, D.M., et al., *J. Am. Chem. Soc.*, 1962, vol. 84, pp. 3618–3622.
Orata, D., et al., *J. Am. Chem. Soc.*, 1987, vol. 109, pp. 3574–3581.
Yassar, A., et al., *Polym. Commun.*, 1987, vol. 28, pp. 103–104.
Buckley, L., et al., *Internat. SAMPE Electron. Conf.*, 1987, vol. 1, pp. 286–293.

(List continued on next page.)

*Primary Examiner*—Leszek Kiliman
*Attorney, Agent, or Firm*—Leigh P. Gregory

[57] ABSTRACT

Organic inherently conductive polymers, such as those based on polyaniline, polypyrrole and polythiophene, are formed in-situ onto polymeric surfaces that are chemically activated to bond ionically the conductive polymers to the substrates. The polymeric substrate is preferably a preshaped or preformed thermoplastic film, fabric, or tube, although other forms of thermoplastic and thermoset polymers can be used as the substrates for pretreatment using, most preferably, phosphonylation-based processes followed by exposure to an oxidatively polymerizable compound capable of forming an electrically conductive polymer. The resultant conductive surface imparts unique properties to the substrates and allows their use in antistatic clothing, surface conducting films for electronic components and the like, and electromagnetic interference shielding.

6 Claims, No Drawings

OTHER PUBLICATIONS

Dao, L.H., et al., *ANTEC,* 1991, pp. 861–863.

Niwa, O., et al., *Polymer J.,* 1987, vol. 19, No. 11, pp. 1293–1301.

Pron, A., et al., *Synth. Met.,* 1987, vol. 18, pp. 49–52.

Gregory, R.V., et al., *Synth. Met.,* 1989, vol. 28., pp. C823–C835.

Kuhn, H.H., "Characterization and Application of Polypyrrole–Coated Textiles," *Intrinsically Conducting Polymers: An Emerging Technology,* 1993, pp. 25–34.

Chan, H.S.O., et al., *Synth. Met.,* 1990, vol. 35, pp. 333–334.

Cai, Z., et al., *J. Am. Chem. Soc.,* 1989, vol. 111, pp. 4138–4139.

Lei, J., et al., *Synth. Met.,* 1992, vol. 47, pp. 351–359.

MOLECULARLY BONDED INHERENTLY CONDUCTIVE POLYMERS ON SUBSTRATES AND SHAPED ARTICLES THEREOF

FIELD OF THE INVENTION

The present invention relates to polymeric articles with conductive surfaces comprising molecularly bound inherently conductive polymers and methods for in-situ formation of such surfaces. More specifically, this invention relates to articles whose surfaces are made conductive by the in-situ formation of inherently conductive polymers such as those based on polyaniline, polypyrrole, and polythiophene, in the presence of chemically activated polymeric substrates produced through processes such as those based on phosphonylation. Most specifically, this invention deals with preformed thermoplastic and thermoset polymeric articles capable of displaying surface conductivity, barrier properties to microwave and similar radiation, changing conductivity in the presence of oxidizing by-products of contacting biologic environments, and exhibiting no adverse effect to viable cells such as fibroblasts. Also within the scope of the present invention are polymeric articles with conductive surfaces comprising metals such as gold, platinum, and copper among others.

BACKGROUND OF THE INVENTION

Conventionally, materials are classified as metals, semiconductors, or insulators according to their ability to conduct electricity. In a material, electrons are organized in discrete energy levels or bands separated by a distinct amount of energy. According to band theory, if the highest filled band is only partly full, the empty states will assist conduction. The energy required to promote an electron from one energy band to the next higher band is called the band gap energy. Its magnitude determines whether such a material is a metal, semiconductor, or insulator. The energy level at the midpoint between the two bands is termed the Fermi level.

In metals the partially filled upper band is referred to as the conduction band. Addition of small amounts of energy excites electrons in this level quite easily. These easily excited electrons are responsible for the electrically conducting nature of metals. For a semiconductor, the valence band is completely filled, and the conduction band is completely empty. Therefore, exciting an electron requires the addition of energy equal to that of the band gap energy, approximately 1 eV at room temperature. Similarly, insulators have a completely filled valence band and a completely empty conduction band. However, the band gap energy required to move an electron into the unfilled conduction band is much greater than that of a semiconductor, on the order of 15 eV. Insulators, therefore, do not conduct electricity except under the application of rather large voltages.

Although most polymers are insulators, a class of inherently conductive polymers (ICPs) exists that cannot be classified in any of the above categories. Through oxidation and reduction reactions, ICPs are doped to electrically conductive states. The radical cations and radical anions formed in these reactions are accompanied by a distortion or relaxation of the polymer lattice which acts to minimize the local strain energy. The energy level associated with these distortions is split from the continuum of band states and symmetrically positioned about the Fermi level.

ICPs can be divided into two groups, those possessing degenerate ground states and those without degenerate ground states. ICPs with degenerate ground states, e.g. polyacetylenes, do not have a determined sense of bond alternation. In these materials, the transposition of single and double bonds yields energetically equivalent structures. Most ICPs, such as poly(p-phenylene), are non-degenerate. In these materials, the transposition of single and double bonds leads to the formation of quinoid structures of significantly higher energy than the parent aromatic forms.

The level of conductivity achieved in ICPs depends on the molecular structure of the polymer backbone, the degree of doping, and the nature of the counter ion species incorporated. Conductive polymers display an impressive range of electrical conductivity produced by controlled doping. The considerably larger conductivity range in ICPs compared to semiconductor crystals results from the intrinsic difference in their structures. Because of their rigid, three dimensional lattice structure, inorganic semiconductors can only accept dopant ions at low concentrations and therefore have a limited conductivity range. ICPs, on the other hand, consist of an assembly of pseudo-one-dimensional conjugate chains. They are able to accept far more dopant ions, thereby achieving a greater range of conductivity.

Polyaniline has the generalized structure:

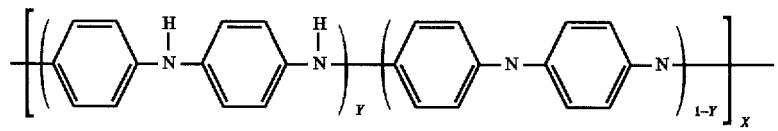

Theoretically, Y can vary continuously from one, yielding the completely reduced structure, to zero, yielding the completely oxidized form. The terms leucoemeraldine, emeraldine, and pernigraniline refer to the different oxidation states of polyaniline where Y=1, 0.5, and 0, respectively. Leucoemeraldine, the completely reduced form, and pernigraniline, the completely oxidized form, are both unstable in air. Leucoemeraldine is oxidized toward emeraldine while pernigraniline degrades. The imine nitrogens in any of these three base forms can be protonated to give the corresponding salts. However, of all the various forms of polyaniline, only the emeraldine salt form is conductive.

The emeraldine salt form of polyaniline can be synthesized by the chemical or electrochemical oxidation of aniline in an aqueous acid solution. Emeraldine salt can also be synthesized by doping emeraldine base with aqueous protonic acids, which yields a nine to ten order of magnitude increase in conductivity. Accompanying this increase in conductivity is a concomitant change in the polymer's color from blue to green.

Polyaniline can be chemically synthesized in its emeraldine hydrochloride salt form through the oxidative polymerization of aniline in aqueous acid media, the most commonly used oxidative solution being ammonium peroxydisulfate in aqueous hydrochloric acid. The resulting protonated polymer is a polysemiquinone radical cation, one resonance form consisting of two separated polarons. The counter ion is incorporated in order to maintain charge neutrality. In the alternative resonance form, the charge and spin are placed on the other set of nitrogen atoms. Emeraldine hydrochloride, therefore, is expected to have extensive spin and charge delocalization.

Emeraldine salt can be prepared by doping emeraldine base in aqueous protonic acid. The major difference between the doping of emeraldine base and the doping of all other neutral conductive polymers is that emeraldine base is mainly protonated by acids while other conductive polymers are doped by counter ions. The conventional method of so called p-doping an organic polymer involves removal of electrons from the polymer's pi system through oxidation. Protonation, however, is a simple acid/base interaction in which no formal oxidation or reduction occurs. The ICP receives a proton which interacts with and hence partly depopulates the pi system, causing a concomitant increase in conductivity. Polyaniline, then, is unique from all other conductive polymers in that its conductivity depends on two variables instead of just one, i.e. its degree of oxidation and its degree of protonation.

The protonation of emeraldine base to form emeraldine hydrochloride is a reversible process. Emeraldine hydrochloride can be treated with ammonium hydroxide to yield emeraldine base. The reversible nature of this conductor-to-insulator transition is one of polyaniline's most important characteristics.

Pyrrole is polymerized by an oxidative process. Polypyrrole can be prepared either chemically through solution processing or electrochemically through polymer deposition at an electrode. Both processes involve electron transfer. The polymerization proceeds via the radical cation of the monomer which reacts with a second radical cation to give a dimer by elimination of two protons. Dimers and higher oligomers are also oxidized and react further with the radical cations to build up the polypyrrole chain. The polymer is thus formed by eliminating two hydrogens from each pyrrole unit and linking the pyrroles together via the carbons from which the hydrogens were eliminated.

Pyrrole is readily polymerized by a wide variety of oxidizing agents in aqueous solution. Polypyrrole can also be prepared electrochemically. Typically, polypyrrole films are galvanostatically deposited on a platinum electrode surface using a one-compartment cell containing an aqueous solution of pyrrole and an oxidizing agent.

Although polypyrrole is prepared in its oxidized conducting state, the resulting polymer can be subsequently reduced to give the neutral, highly insulating form. Electrochemical switching between the conducting and insulating state is accompanied by a color change from blue-black to yellow-green and a conductivity change which spans about ten orders of magnitude. As with polyaniline, switching between conducting and insulating states is a reversible process.

Conductive polymers have traditionally been plagued by problems of stability, narrowly defined here as the maintenance of conductivity. In the process of oxidative doping, ICPs are stripped of a fraction of their electrons, thereby increasing their conductivity by several orders of magnitude. While the gaps left by the lost electrons provide a pathway for charge to be conducted down the polymer chain, they also make the polymer highly reactive with oxygen and water. Stabilization, then, becomes an effort to minimize doping site loss by chemical degradation or doping site quenching by such contaminants as oxygen or water. Various methods have proven effective in stabilizing ICPs; among these are encapsulation techniques and the use of barrier resins and sacrificial layers.

Compared to other conjugated polymers, polyaniline and polypyrrole have an unusually good chemical stability and encounter only a minimal loss of conductivity upon exposure to ambient environments. For example, it has been found that the conductivity of emeraldine hydrochloride formed by the protonation of emeraldine base did not change during extended periods in laboratory air. Similarly, the electrical properties of polypyrrole are indefinitely stable in air at room temperature.

Because ICPs form rigid, tightly packed chains, they are generally resistant to processing, a problem which has limited their widespread commercial use. While tight chain packing is essential for interchain charge hopping, it also prevents the polymer from intermixing with solvent molecules. Therefore, as a whole, ICPs tend to form as intractable masses. Many approaches to synthesizing tractable ICPs have been explored including substituted derivatives, copolymers, polyblends, colloidal dispersions, coated latexes, and ICP composites. These efforts have yielded a rich variety of blends, random copolymers, and graft and block copolymers with enhanced processability.

For many years, researchers have strived to prepare smooth, coherent films of polyaniline and polypyrrole. In 1968, cohesive polypyrrole films were electrochemically prepared at an electrode surface. The electrochemical preparation of free standing polyaniline films with a fairly smooth, featureless topography was accomplished in the early eighties. Unfortunately, ICPs formed by electrochemical polymerization are generally insoluble and brittle.

In an effort to produce conductive polymer films with improved mechanical properties, researchers have attempted to synthesize ICPs on polymeric supports. Because such supports are normally electrical insulators, the standard electrochemical methods of deposition are difficult to apply. Most research, therefore, has centered on the chemical polymerization of ICPs on suitable substrates.

For example, polypyrrole films have been formed on the surface of a polyvinyl alcohol-ferric chloride ($PVA$-$FeCl_3$) complex. An aqueous solution containing a mixture of polyvinyl alcohol and ferric chloride was deposited on a polyester support and allowed to evaporate. The $PVA$-$FeCl_3$ was then suspended over a solution of pyrrole in ethanol. Under these conditions, polymerization of pyrrole occurred on the $PVA$-$FeCl_3$ surface to produce a highly conducting, flexible laminate.

Also, pyrrole has been electrochemically polymerized onto an electrode covered with vinylidene fluoride-trifluoroethylene copolymer (P(VDF-TrFE)). Electrochemical polymerization of pyrrole was carried out in a one compartment cell containing an electrode covered with the copolymer. Polypyrrole was incorporated into the P(VDF-TrFE) film beginning at the electrode surface and continuing through to the film surface. This process resulted in very flexible and stretchable conducting films.

A method has been devised to coat textiles with a uniform layer of electrically conducting polymer via an absorption process. Polyaniline and polypyrrole are solution-polymerized onto nylon and polyethylene terephthalate fabrics. Examination of the fabrics indicates that each individual fiber is encased with a smooth, coherent layer of the ICP.

Similarly, a method has been developed for making an electrically conductive textile material which is a textile material made predominantly of fibers selected from polyester, polyamide, acrylic, polybenzimidazole, glass and ceramic fibers, wherein the textile material is covered to a uniform thickness of from about 0.05 to about 2 microns through chemical oxidation in an aqueous solution with a coherent, ordered film of an electrically conductive, organic polymer selected from a pyrrole polymer and an aniline polymer. Examination of such materials indicates that each individual fiber is encased or enveloped with a smooth, coherent layer of the ICP.

Ultra-thin films of emeraldine hydrochloride have been formed on poly(methyl methacrylate) (PMMA) and polystyrene (PS) substrates. The laminate films are formed by the oxidative polymerization of aniline at the interface between a lower oxidizing aqueous solution and an immiscible solution of the polymer and aniline monomer in chloroform. Volatilization of the chloroform yields a free-standing laminate film of the desired polymer substrate coated on one side with a continuous layer of emeraldine hydrochloride. These laminate films possess the mechanical properties of the substrate and exhibit conductivities in the region of 10 S/cm.

ICPs have been polymerized in the pores of microporous support membranes, yielding thin, conductive films on the membrane surface. In one process, a microporous membrane is used to separate a solution of a heterocyclic monomer from a soxidion of a chemical oxidizing agent. As the monomer and oxidizing agent diffuse toward each other through the pores in the membrane, they react to yield conducting polymers. The result is an ultrathin film, electrically conducting composite polymer membrane.

An interfacial polymerization method has been developed in which the pores of a microporous support membrane are filled with an oxidative polymerization reagent. The membrane-confined solution is exposed to a vapor phase containing a monomer which can be oxidatively polymerized to yield a conductive polymer. A thin, defect-free film of the conductive polymer grows across the surface of the microporous support membrane.

Recently, strong and highly conductive films up to 0.6 mm thick have been formed from polyaniline gels. These gels are prepared from emeraldine base solutions in N-methyl-2-pyrrolidinone. The films are doped with a variety of doping agents. In terms of conductivity, mechanical properties, and thermal stability, methane sulfonic acid and ethane sulfonic acid dopants yield the best films.

Surface phosphonylation has been achieved through a modified Arbuzov reaction by Shalaby et al. in U.S. Pat. No. 5,558,517 and U.S. Pat. No. 5,491,198 . The creation of acid-forming functional groups on surfaces takes place in two steps. The first step entails chlorophosphonylation of a hydrocarbon moiety via the reaction of phosphorus trichloride ($PCl_3$) and oxygen, which yields alkyl phosphonic dichlorides. The phosphonyl dichlorides are subsequently hydrolyzed to phosphonic acid.

Furthermore, a liquid phase method for the surface phosphonylation of preformed thermoplastic polymers has been developed. The polymer is placed in a solution of 10% (v/v) $PCl_3$ in carbon tetrachloride which is bubbled with oxygen. Additionally, a gas phase process for surface phosphonylation has been developed. In this method, the polymer is suspended in a flask containing several drops of $PCl_3$ and oxygen gas. In each method, the polymer is quenched in water after allowing the reaction ample time to reach completion. Characterization of the polymers treated by each method indicates the presence of reactive phosphonate groups on their surface and no change in the bulk material properties.

SUMMARY OF THE INVENTION

Therefore, it is an object of the present invention to provide surface-conducting preformed articles comprising a molecularly bonded inherently conductive polymer to a thermoplastic or thermoset substrate.

It is also an object of the present invention to provide a process for binding molecularly and in-situ forming inherently conductive polymer to chemically activated organic substrates, where the activation entails surface phosphonylation.

It is yet another object of the present invention to provide a method for forming conductive polymers onto the surfaces of preshaped articles which does not require that the conductive polymer outer layer envelope or encase the underlying article such that only preselected areas of an article's surface may receive an outer layer of a conductive polymer.

It is yet a further object of the present invention to provide a method for forming conductive polymers onto the surfaces of preshaped articles which does not require that the conductive polymer outer layer envelope or encase the underlying article such that relatively large preshaped articles may receive an outer layer of a conductive polymer.

It is yet another object of the invention to provide a surface-conducting polyethylene film comprising molecularly bound, inherently conductive, polyaniline, polypyrrole or polythiophene to a phosphonylated precursor film.

It is a further object of the present invention to provide an electrically conductive article which includes an outer layer of an inherently conductive polymer which is molecularly bonded to a substrate of an organic polymer or a polymeric composite and which retains conductivity after agitation such as sonication.

It is a still further object of the present invention to provide surface conducting substrates which can be used in antistatic and electromagnetic shielding articles as well as biosensing, cell-compatible devices.

It is still a further object of the present invention to provide surface-conducting preformed articles which include a thin layer of a metal molecularly bound to a thermoplastic or thermoset substrate.

It is yet another object of the invention to provide a surface-conducting article comprising a metal bound to a phosphonylated substrate.

These as well as other objects are achieved by providing a method for imparting electrical conductivity to an article which includes the steps of pretreating the surface of the article to produce a chemically interactive surface having acid-forming functional groups thereon, each of said functional groups having a multivalent central atom, and contacting the pretreated surface with a solution of an oxidatively polymerizable compound, selected from a pyrrole compound, an aniline compound and a thiophene compound, whereby an electrically conductive polymer is formed and doped at the surface of said article and is thereby molecularly bound to said surface.

Such objects are also achieved by providing a method for imparting electrical conductivity to an article which includes the steps of pretreating the surface of the article to produce a chemically interactive surface having acid-forming functional groups thereon, with each of the functional groups having a multivalent central atom, and depositing an electrically conductive material onto the pretreated surface.

These objects are further achieved by providing an electrically conductive article which includes a polymeric substrate, and a coherent, uniform outer layer of an electrically conductive, organic polymer selected from a pyrrole polymer, an aniline polymer and a thiophene polymer, wherein said outer organic polymer layer is molecularly bonded to said polymeric substrate.

DETAILED DESCRIPTION OF THE INVENTION

The present invention is directed to the formation of a layer or film of a conductive polymer onto the surface of a polymeric article. Rather than merely enveloping or encasing the article, the present conductive polymer layer is molecularly bound to the outer surface of the article. Such bonding provides for an outermost conductive layer which is strongly adhered to the article and allows the article to have any of a variety of forms and sizes. Within the scope of the present invention are, for example, films, fibers, textile materials, and molded articles formed from polymers such as polyolefins, polyamides, polyesters, polyurethanes, polyketones, polystyrene, and members of the vinyl and acrylic families of polymers and copolymers thereof, as well as articles formed from polymeric composites.

Articles produced in accordance with the present invention are suitable and appropriate for a variety of end use applications where conductivity may be desired including, for example, antistatic garments, antistatic floor coverings, components in computers, and generally, as replacements for metallic conductors, or semiconductors, including such specific applications as, for example, batteries, photovoltaics, electrostatic dissipation and electromagnetic shielding, for example, as antistatic wrappings of electronic equipment or electromagnetic interference shields for computers and other sensitive instruments, including aerospace applications and biomedical devices. A preferred end use for the present invention includes medical applications such as surgical and diagnositic devices and instruments, or components thereof, conductive wires or leads for activation of biological processes, and antistatic clothing for use by operation room personnel. Further applications include coatings for controlled heat transfer.

Broadly, the method of the present invention is directed to a pretreatment step which renders the outer surface of the polymeric article reactive by providing acid-forming functional groups with each group having a multivalent central atom followed by a polymerization step whereby a precursor monomer of a conductive polymer is polymerized directly onto the reactive surface. In addition to providing for molecular bonding of the conductive polymer to the article's surface, the functional groups act, at least in part, as both a doping agent and an oxidizing agent to aid in polymerization.

A preferred means for completing the pretreatment step of the present invention is disclosed in U.S. Pat. No. 5,491,198 entitled "Process For Phosphonylating the Surface of an Organic Polymeric Preform," and U.S. Pat. No. 5,558,517 entitled "Process For Phosphonylating the Surface of an Organic Polymeric Preform and Phosphonylated Preform Produced Thereby," both of which are incorporated herein by reference. Generally, such patent applications are directed to a process for producing a phosphonylated surface on an organic polymer with available reactive —CH— moieties and application of the process to the production of pre-shaped articles. Although phosphonylation is a preferred means for pretreating polymeric articles in accordance with the present invention, other reactions which produce acid-forming functional groups having multivalent central atoms, such as, for example, sulfonylation, may also be employed.

Preferred conductive polymers to be formed in accordance with the present invention include polyaniline, polypyrrole and polythiophene although any polymer which forms polaronic or bipolaronic moieties may be employed. As discussed above, polarons and bipolarons are, generally, the charge carrying species which are generated by the oxidation of the conjugated polymer backbone. In the case of polyaniline, polarons are formed by protonation as is also discussed above. The polaronic and bipolaronic states of polypyrrole are:

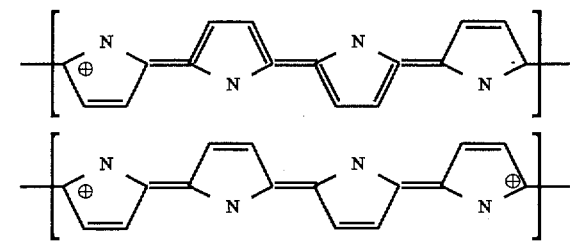

wherein the polarons produced by initial oxidation include a positive charge and an unpaired electron, with further oxidation yielding the bipolaron with two positive charges. The polaronic state for polyaniline is:

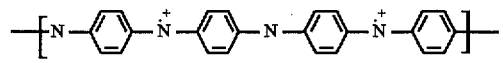

wherein such state is produced by protonation of a quinodal polyaniline configuration rather than electron removal. For purposes of the present invention it is believed that the positive charge formed along the polymer backbone by oxidation or protonation allows for ionic bonding of the polymer to the negatively charged counter ions remaining when the acid-forming functional groups of the present chemically interactive surface dissociate in an aqueous solution.

Doping agents are generally strong acids such as p-toluenesulfonic acid, naphthalene disulfonic acid, methane sulfonic acid, chloromethyl sulfonic acid, fluoromethyl sulfonic acid, oxalic acid, sulfosalicylic acid and trifluoroacetic acid. However, the acid moieties of the functional groups formed on the surface during pretreatment may also serve as dopants, either in combination with an externally supplied doping agent, or alone, as is evidenced in Examples 7 and 8, below. Similarly, oxidizing agents such as ammonium peroxydisulfate, ferric chloride, salts of permanganates, peracetates, chromates and dichromates may be employed, although the multivalent central atom of the functional groups on the article's chemically interactive surface may also serve as an oxidizing agent, either in combination with an externally supplied oxidizing agent, or alone, as is evidenced in Example 8 below.

Electrically conductive articles formed in accordance with the present invention include an outer layer of an inherently conductive polymer which is bonded to the preshaped substrate. As compared to electrically conductive textile fibers of the prior art which had, essentially, an outer shell of a conductive polymer enveloping or encasing each underlying fiber substrate, the present outer ICP layer is believed to be ionically bonded to the underlying substrate. Such bonding scheme is verified by the retention of electrical conductivity following a period of agitation, such as sonication as is demonstrated by the Examples below.

Most generally the present invention is directed to pretreatment by phosphonylation or an equivalent means for imparting appropriate reactivity to a polymeric article's surface followed by deposition of a conductive material onto the surface. Although, in preferred embodiments, such deposition involves the formation of an inherently conductive polymer onto the pretreated surface, in alternative embodiments other conducting materials may be deposited onto the pretreated surface by other methods. For example, metals such as gold, platinum, chromium, copper, silver, cobalt, and titanium may be deposited onto the interactive surface by any of a variety of methods including sputtering, vapor phase deposition, and electrochemical deposition, among others. As in the Examples relating to the formation of inherently conductive polymers onto a polymer substrate, Example 21, below, verifies the strong adherence of a metal onto a phosphonylated polymeric substrate in accordance with the present invention.

The following techniques were used to analyze and characterize samples produced in accordance with the present invention and comparative examples of the prior art as is shown in the Examples below.

Fourier Transform Infrared Spectroscopy (FTIR) was used to quantify changes in the composition and bonding at film surfaces. In the internal reflection mode FTIR permits recording of the diagnostic infrared finger print of thin films formed onto a surface without interference from the bulk material. Basically, FTIR identifies absorbance peaks at characteristic wave numbers associated with known chemical bonds. For present purposes, FTIR was employed to identify characteristic peaks associated with bonds formed by the incorporation of phosphonate side groups in the polymer backbone of phosphonylated films prior to polymerization of any conductive polymer thereon. Then, the phosphonylated film spectra was compared with those of conductive polymer-bonded films in an effort to elucidate bonding schemes at the film surface. The present FTIR spectra were obtained using an infrared spectrometer, model FT-45 from BioRad Digilab Division.

Energy Dispersive X-ray (EDX) is a technique which allows for the elemental analysis of the uppermost layer of a material. In the present Examples, phosphonylated and non-phosphonylated films were analyzed for comparison with inventive and comparative film/conductive polymer composites. The present EDX spectra were obtained using a JEOL JSM-IC848 scanning microscope.

Electron Spectroscopy Chemical Analysis (ESCA) is a more precise technique for determining the chemical composition of the outermost surface layer of a material.

Contact angle measurements measure the wettability of a material providing one of the fastest and most sensitive methods for identifying changes in the surface polarity of a material. Simply, drops of water are placed on the sample surface and static contact angles are measured. For the present Examples contact angle measurements were made using a contact angle goniometer from Gaertner Scientific Corp.

Surface resistivities were measured to evaluate relative surface conductance using a four point probe technique on an Alessi C4S-44 probe. A Bioanalytical System BAS 100b electrochemical analyzer was used as the current source. A Fluke 8040A multimeter measured the resistance between the middle two probe tips. The probe tips were set in a linear configuration, and a constant current of 0.3 µA was applied between tips 1 and 4. The resistance was measured between tips 2 and 3. Several measurements were taken for each sample, and their average was recorded.

Peel tests were performed to evaluate the adherence of the conductive polymer to phosphonylated and non-phosphonylated films. For present purposes two separate peel tests were employed. In the first, samples were adhered to steel plates using an epoxy and placed in a press under an eleven metric ton force at room temperature. After twelve hours the samples were peeled off the stainless steel surface. Observations of any residue remaining on the plates were recorded, and the plates were photographed.

In an effort to quantify the first peel test, a second peel test was conducted on a Liveco Vitrodyne V1000 tensile testing apparatus. Samples of each conductive film were prepared. Adhesive tape was applied along the length of each film, leaving an excess at one end for gripping in a tensile clamp. The tape was then pressed onto the films in a press under an eleven metric ton force to ensure that it was evenly adhered to each sample. Each sample was subsequently adhered to a sliding cart using double face tape, and the free end of the adhesive tape was secured in the tensile grip of the Vitrodyne. The tape was pulled from the film at an angle of 90° to the film and a rate of 25 mm/min. The force required to remove the tape was sampled at a rate of 2 pts/sec, that is, two force measurements per second.

A direct contact cytotoxicity test was performed to study cell proliferation in the presence of the films. A modification of ASTM standard F813-83: Direct Contact Cell Culture Evaluation of Materials for Medical Devices, was used to determine the materials' effects on cell proliferation. As suggested in the standard, L-929 mouse fibroblasts were used.

EXAMPLE 1

Preparation of Polyethylene Films

Ultra-high molecular weight polyethylene (UHMW-PE) films were pressed from Hoechst Celanese GUR 405 powder, a 5,000,000 MW ethylene homopolymer, in a Carver laboratory press Model C, Fred S. Carver Inc. The powder was spread evenly in a metal shim sandwiched between teflon coated stainless steel plates. The assembly was placed in the press at a temperature of 165° C. Upon complete melting of the powder, an eleven metric ton force was applied; the heating elements were turned off and the press was left to cool to room temperature. Samples were cut from these films in sizes appropriate for each test. Prior to phosphonylation, the samples were rinsed in acetone and dried in a vacuum oven at 40° C.

EXAMPLE 2

Liquid Phase PhoSphonylation of Polyethylene Films

Sample films were phosphonylated in the liquid phase as follows. The films were placed in a closed container equipped with a gas bubbler. A solution of 10% (v/v) phosphorus trichloride ($PCl_3$) in carbon tetrachloride ($CCl_4$) was added to the container. Oxygen was bubbled through the solution at a pressure of 5 mm Hg for four hours. The samples were then removed from the solution, sonicated in deionized water for one hour, and dried under dynamic vacuum at 25° C.

EXAMPLE 3

Gas Phase Phosphonylation of Polyethylene Films

Films were phosphonylated in the gas phase as follows. Fifteen drops of $PCl_3$ were put in a flat bottom boiling flask with a magnetic stir bar. A sample film was suspended in the flask using a polyethylene fiber. The flask was evacuated, filled with oxygen, and equilibrated to atmospheric pressure. The gas was mixed for four hours at room temperature on a Corning laboratory stirrer/hot plate Model PC-320. After phosphonylation, the samples were sonicated in deionized water for one hour, rinsed twice with fresh deionized water, and dried under dynamic vacuum.

EXAMPLE 4

In-situ Formation of Ionically Bound Polyaniline on Phosphonylated Polyethylene Polyaniline was deposited on phosphonylated UHMW-PE films via an in-situ polymerization technique whereby emeraldine hydrochloride salt was deposited on the films through the oxidative polymerization of aniline in aqueous hydrochloric acid (HCl) by ammonium peroxydisulfate. A solution of 0.45% (w/v) aniline and 0.45% (w/v) ammonium peroxydisulfate in 1M HCl(aq.) was used. Sample films were added to this solution and mixed continuously in an ice bath for two hours using a Fisher Scientific Dyna-Mix®. To improve their stability, the films were first de-doped by soaking a 10% (v/v) solution of ammonium hydroxide for thirty minutes at room temperature. They were subsequently re-doped by soaking in a 10% (w/v) solution of p-toluenesulfonic acid, again for thirty minutes at room temperature. The samples were sonicated in deionized water for two hours, rinsed with fresh deionized water, and dried under dynamic vacuum at room temperature. The conductive polymers appeared as a continuous, uniform layer which remained tightly bound to the phosphonylated surface even after sonication and vigorous rubbing.

COMPARATIVE EXAMPLE 5

In-situ Formation of Polyaniline on Non-Phosphonylated Polyethylene

Polyaniline was deposited on non-phosphonylated UHMW-PE films via an in-situ polymerization technique whereby emeraldine hydrochloride salt was deposited on the films through the oxidative polymerization of aniline in aqueous hydrochloric acid (HCl) by ammonium peroxydisulfate. A solution of 0.45% (w/v) aniline and 0.45% (w/v) ammonium peroxydisulfate in 1M HCl(aq.) was used. Sample films were added to this solution and mixed continuously in an ice bath for two hours using a Fisher Scientific Dyna-Mix®. To improve their stability, the films were first de-doped by soaking a 10% (v/v) solution of ammonium hydroxide for thirty minutes at room temperature. They were subsequently re-doped by soaking in a 10% (w/v) solution of p-toluenesulfonic acid, again for thirty minutes at room temperature. The samples were sonicated in deionized water, rinsed with fresh deionized water, and dried under dynamic vacuum at room temperature. The present film was sonicated under milder conditions than the film of Example 4. When a film produced in accordance with the present Comparative Example was sonicated under conditions comparable to those of Example 4, the conductive polymer did not adhere to the substrate but was shaken therefrom. That is, the conductive polymers were deposited as a loosely adhered powder which was easily removed with light tactile pressure. Care had to be taken in handling all films made in accordance with the present Comparative Example throughout their characterization so as not to remove the conductive polymer from the surface.

EXAMPLE 6

In-situ Formation of Ionically Bound Polypyrrole on Phosphonylated Polyethylene Film Polypyrrole was deposited on phosphonylated films using an in-situ polymerization technique. Sample films were submerged in an aqueous solution of 0.30% (w/v) ferric chloride, 0.001M naphthalene disulfonic acid, and 0.005M pyrrole. The solution was mixed at room temperature for two hours at 25 rpm. After removal from the solution, the films were sonicated in deionized water for two hours, rinsed with fresh deionized water, and dried under dynamic vacuum at room temperature. The conductive polymers appeared as a continuous, uniform layer which remained tightly bound to the phosphonylated surface even after sonication and vigorous rubbing.

EXAMPLE 7

In-situ Formation of Ionically Bound Polypyrrole on Phosphonylated Polyethylene Film Polypyrrole was deposited on phosphonylated films using an in-situ polymerization technique. Sample films were submerged in an aqueous solution of 0.30% (w/v) ferric chloride and 0.005M pyrrole for 24 hours. After removal from the solution, the films were sonicated in deionized water for two hours, rinsed with fresh deionized water, and dried under dynamic vacuum at room temperature. Films made in accordance with this example were found to be conductive. The conductive polymers appeared as a continuous, uniform layer which remained tightly bound to the phosphonylated surface even after sonication and vigorous rubbing.

EXAMPLE 8

In-situ Formation of Ionically Bound Polypyrrole on Phosphonylated Polyethylene Film Polypyrrole was deposited on phosphonylated films using an in situ polymerization technique. Sample films were submerged in an aqueous solution of 0.005M pyrrole for 96 hours. After removal from the solution, the films were sonicated in deionized water for two hours, rinsed with fresh deionized water, and dried under dynamic vacuum at room temperature. The polypyrrole which was formed onto the film phosphonylated surface appeared as a continuous, uniform layer which remained tightly bound to the surface even after sonication and vigorous rubbing. Although it was not possible to determine conductivity for the present outer layer of polypyrrole at the sensitivity employed in evaluating films of the other Examples, the polypyrrole was dark grey in color rather than yellow or yellow-green indicating that doping by protonation had occurred.

COMPARATIVE EXAMPLE 9

In Situ Formation of Polypyrrole on Non-Phosphonylated Polyethylene Films

Polypyrrole was deposited onto non-phosphonylated films using an in-situ polymerization technique. Sample films were submerged in an aqueous solution of 0.30% (w/v) ferric chloride, 0.001M naphthalene disulfonic acid, and 0.005M pyrrole. The solution was mixed at room temperature for two hours at 25 rpm. After removal from the solution, the films were sonicated in deionized water, rinsed with fresh deionized water, and dried under dynamic vacuum at room temperature. The present films were sonicated under milder conditions than the films of Examples 6, 7, and 8. When a film in accordance with the present Comparative Example was sonicated under conditions comparable to those of Examples 6, 7, and 8, the conductive polymer did not adhere to the substrate but was shaken therefrom. That is, the conductive polymers were deposited as a loosely adhered powder which was easily removed with light tactile pressure. Care had to be taken in handling all films made in accordance with the present Comparative Example throughout their characterization so as not to remove the conductive polymer from the surface.

EXAMPLE 10

FTIR Studies

FTIR spectra of the phosphonylated polymer surfaces were obtained and compared with those of the control surfaces to chart the characteristic group frequencies of the modified polymer surfaces. The FTIR spectra of the phosphonylated UHMW-PE film of Example 3 showed characteristic peaks at 1143, 998, and 935 cm$^{-1}$.

The spectra of the polyaniline control film of Comparative Example 5 displayed characteristic peaks at 1586, 1506, 1337, 1308, 1166, 1146, 1123, 1033, 1009, 821, and 801 cm$^{-1}$. The FTIR spectra of the polyaniline bonded phosphonylated film of Example 4 indicated that these peaks were almost completely preserved. In addition, the spectra of the film of Example 4 showed two new peaks at 988 and 929 cm$^{-1}$. These peaks are attributed to phosphonate groups from phosphonylation.

The spectra of the polypyrrole control film of Comparative Example 9 indicated characteristic peaks at 1575, 1305, 1177, 1047, 967, 908, and 897 cm$^{-1}$. The spectra for the polypyrrole bonded phosphonylated film of Example 6 showed that these peaks are preserved and even amplified. In addition, the spectra for the film of Example 6 indicated the presence of a new peak at 931 cm$^{-1}$. As in the case of the polyaniline bonded phosphonylated film, this peak is attributed to phosphonate groups. This is indicative of the ultrathin nature of the conductive polymer surface layer which allows the incident IR beam to penetrate and resonate with the phosphonylated subsurface below the conductive surface.

EXAMPLE 11

EDX Studies

EDX spectra were used to confirm the presence of phosphorus, chlorine, sulfur, and iron on the polymer surfaces. The relative concentrations of elements present on each material were examined.

The EDX spectra of the phosphonylated film of Example 3 demonstrated the presence of phosphorus and a minor amount of chlorine. The spectra of the polyaniline control film of Comparative Example 5 indicated the presence of sulfur and chlorine, elements present in the solution used in the polymerization of aniline. As expected, the spectra for the polyaniline bonded phosphonylated film of Example 4 demonstrated the presence of phosphorus in addition to sulfur and chlorine. The spectra of the polypyrrole control film of Comparative Example 9 indicated the presence of sulfur and chlorine. The spectra for the polypyrrole bonded phosphonylated film of Example 6 indicated the presence of sulfur and chlorine, elements present in polypyrrole solution processing, along with phosphorus from phosphonylation.

EXAMPLE 12

ESCA Studies

Table I shows the results of ESCA conducted on a phosphonylated UHMW-PE film made in accordance with Example 3, a polyaniline bonded phosphonylated film of Example 4, and a polypyrrole bonded phosphonylated film of Example 6. The ratio of carbon to phosphorus on the phosphonylated film of Example 3 indicates that about 30% of the carbons on the UHMW-PE surface were phosphonylated. The absence of phosphorus on the scan of the polyaniline bonded phosphonylated film of Example 4 indicates that the conductive polymer layer was thicker than the ESCA scanning depth of 50 Angstroms. Sulfur, oxygen, and chlorine are present in the polyaniline layer in the form of dopant ions. Using the base structure of polyaniline, the expected C:N ratio is 6:1. The experimentally determined C:N ratio was 10:1. Discrepancies between the expected and experimental values may be caused by the orientation of polyaniline molecules on the film surface.

TABLE I

| ESCA Results, % Elements Present | | | | | | |
|---|---|---|---|---|---|---|
| Film Type | C | O | N | P | S | Cl |
| Phosphonylated (Example 3) | 45.1 | 42.4 | nd | 12.5 | nd | nd |
| Polyaniline Phosphonylated (Example 4) | 78.6 | 10.2 | 7.8 | nd | 2.3 | 1.0 |
| Polypyrrole Phosphonylated (Example 6) | 65.8 | 20.4 | 8.6 | 2.4 | 2.3 | 0.5 |

The scan of the polypyrrole bonded phosphonylated film of Example 6 indicated the presence of some phosphorus on the surface; therefore, the polypyrrole layer on this film was not quite as thick at the polyaniline layer on the film of Example 4. The theoretical C:N ratio of the polypyrrole structure is 4:1. The experimentally determined C:N ratio was about 8:1. Clearly some of the excess carbon can be attributed to UHMW-PE seen in the scan. Here, too, the orientation of the polypyrrole molecules on the surface may account for some of the differences in the expected and experimentally determined values.

EXAMPLE 13

Contact Angle Measurements

Contact angles were measured for all film types. The UHMW-PE film of Example 1 showed an average contact angle of 86° which decreased to 58° upon phosphonylation in accordance with Example 3. This decrease was expected as hydrophilic moieties were created on hydrophobic surfaces. The polyaniline control film of Comparative Example 5 showed an average contact angle of 33°, a decrease from the angle measured for the precursor UHMW-PE film of Example 1. However, the contact angle decreased even further for polyaniline bonded phosphonylated film of Example 4 which had a contact angle of less than 5°. The polypyrrole control film of Comparative Example 9 had a contact angle of 54°. The angle decreased to 29° for the polypyrrole bonded phosphonylated film of Example 6. To ensure these apparent decreases in contact angle were, in fact, statistically significant, a Fisher's Least Significant Difference procedure was performed. The averages and standard deviations are in Table II. All decreases indicated above were found to be significant within a 95% confidence interval.

TABLE II

| Film | Avg. ± St. Dev. (°) |
|---|---|
| UHMW-PE (Example 1) | 86.4 ± 1.96 |
| Phosphonylated UHMW-PE (Example 3) | 58.7 ± 10.5 |
| Polyaniline Control (Comparative Example 5) | 32.6 ± 8.93 |
| Polyaniline Bonded Phosphonylated (Example 4) | 5.00 ± — |
| Polypyrrole Control (Comparative Example 9) | 54.0 ± 7.34 |
| Polypyrrole Bonded Phosphonylated (Example 6) | 29.7 ± 8.63 |

EXAMPLE 14

Surface Resistivity

The average surface resistance measured for each film is shown in Table III. All film types showed a decreased resistance over the pressed polyethylene of Example 1 which has a reported bulk resistance of about $10^{14}\Omega$. Approximate t tests for independent samples with unequal variances were performed for data collected for each conductive polymer control and bonded phosphonylated film groups to ensure the differences were statistically significant. The apparent 75% reduction in surface resistance from polyaniline on the UHMW-PE film group to the polyaniline bonded phosphonylated film group was found to be significant for $p<0.001$. Similarly, the 99% reduction in surface resistance from the control to the polypyrrole bonded phosphonylated group was found significant for $p<0.1$. The excessive standard deviations associated with the conductive polymer control films are attributed to the nonuniform and discontinuous nature of the conductive layer on the films.

TABLE III

| Film Resistivity | |
|---|---|
| Polyaniline Control (Comparative Example 5) | 10.3 ± 0.996 |
| Polyaniline Bonded/Phosphonylated (Example 4) | 2.62 ± 0.497 |
| Polypyrrole Control (Comparative Example 9) | 5744 ± 8618 |
| Polypyrrole Bonded/Phosphonylated (Example 6) | 53.2 ± 16.0 |

EXAMPLE 15

Peel Test I

Six samples (2×2.5 cm) of each conductive film of Examples 4 and 6 and Comparative Examples 5 and 9 were prepared. Two highly polished steel plates were cleaned using acetone. As discussed above, samples were adhered to the plates using Elmer's® Home Solution epoxy and placed in the Carver press under an eleven metric ton force at room temperature. After twelve hours the samples were peeled off the stainless steel surface. Observations of any residue remaining on the plates were recorded, and the plates were photographed. All films of both Comparative Examples lost all of the conductive polymer upon peeling of the films from steel plates. Thus, the adhesive joint between the epoxy and the steel plate was stronger than the joint at the conductive polymer/film interface for the non-phosphonylated samples. In contrast, the phosphonylated films retained the conductive polymer almost entirely with only trace amounts of epoxy remaining on the plates. Therefore, the strength of the adhesive joint between the conductive polymer and the phosphonylated surface was stronger than the adhesive joint formed between the epoxy and steel plate. Based on these observations, the adhesive joint between the conductive polymer and phosphonylated film was far greater than that of the conductive polymer/non-phosphonylated film interface.

EXAMPLE 16

Peel Test II

In an effort to quantify the peel test of Example 15, a second peel test was conducted on a Liveco Vitrodyne V1000 tensile testing apparatus, as discussed above. Five 2×3 samples of each conductive film were prepared. Adhesive tape was applied along the length of each film, leaving an excess at one end for gripping in a tensile clamp. The tape was then pressed onto the films in a Carver press under an eleven metric ton force to ensure that it was evenly adhered to each sample. Each sample was subsequently adhered to a sliding cart using double face tape, and the free end of the adhesive tape was secured in the tensile grip of the Vitrodyne. The tape was pulled from the film at an angle of 90° to the film and a rate of 25 mm/min. The force required to remove the tape was sampled at a rate of 2 pts/sec. In all cases, the conductive polymer was removed from all non-phosphonylated films as the tape was peeled away. In contrast, the conductive polymer was retained on the phosphonylated films, and the tape was peeled away cleanly. The force recorded for each trial was taken as the average force recorded after the initial ramp period until the tape was completely removed from the sample. Table IV includes the corresponding average forces and standard deviations. Here again, as in the surface resistance data, the large standard deviations for the conductive polymer control films are an indication of the nonuniformity of these surfaces. In contrast, the rather small standard deviations for the conductive polymer bonded phosphonylated films reflect the uniform nature of these surfaces. The tape adhered to the smooth phosphonylated films better than it did to the powdery control films. Most likely, differences in surface roughness affected adhesion of the tape to the films. The force required to remove the tape from the phosphonylated films was approximately 250% greater than that required to remove the tape from the control film. Approximate t tests for independent samples with unequal variances were performed for data collected for each conductive polymer control and phosphonylated film groups to ensure they were statistically different. The force required to remove the tape from the polyaniline comparative and polyaniline bonded phosphonylated films was found to be statistically different for a level of significance of $p<0.001$. Similarly, the force required to remove the tape from the polypyrrole comparative and polypyrrole bonded phosphonylated films was found to be statistically different for a level of significance in the range $0.005<p<0.01$.

TABLE IV

| Peel Test II Data | |
|---|---|
| Polyaniline Control (Comparative Example 5) | 139 ± 57.9 |
| Polyaniline Bonded/Phosphonylated (Example 4) | 344 ± 5.24 |
| Polypyrrole Control (Comparative Example 9) | 133 ± 86.5 |
| Polypyrrole Bonded/Phosphonylated (Example 6) | 309 ± 19.6 |

EXAMPLE 17

Cytocompatibility of Surface-Conducting Films

A modified version of ASTM standard F813-83: Standard Practice for Direct Contact Cell Culture Evaluation of Materials for Medical Devices was used to determine the cellular response to the bulk materials in a static environment. Two rectangular samples (1.5×3 cm) of each of the films of Examples 1, 3, 4 and 6 and Comparative Examples 5 and 9 were prepared. The films were adhered to polystyrene tissue culture plates (d+3.5 cm) with a small amount of Silastic® from Dow Corning. The plates were left under a Class II Type A/B3 hood (NU-AIRE Biological Safety Cabinets) for three days to sterilize the materials under the U-V light and to give the Silastic® sufficient time to cure. Empty polystyrene tissue culture plates were used as negative controls; tissue culture plates containing one penny each were used as positive controls. L-929 mouse fibroblast cells were obtained from the American Type Culture Collection (ATCC) and cultured according to ATCC guidelines. Each plate was seeded with the same amount of L-929 fibroblast cells and stored in a $CO_2$ Water-Jacketed Incubator at 37° C. (Nu-AIRE TS Autoflow). At 24 hours, cell growth along the perimeter of the films was examined using a Nikon model TMS-F microscope. Photographs were taken with a 35 mm Nikon camera to chronicle the cellular response. At 48 hours trypan blue, a vital stain, was added to each plate. Trypan blue is excluded from healthy, viable cells, but is taken into cells in which the cellular membrane is compromised. The cell plates were then observed under the microscope; the presence or absence of trypan blue in the cells was duly noted.

On positive control plates, a zone of inhibition of about 5 mm about the edge of the penny was observed. Outside this zone, the cells were "balled up" and absorbed trypan blue, indicating that their membranes were compromised. On the negative control polystyrene tissue culture plates, about half of the cells were spread out and only a few cells took in trypan blue. The cells on these plates appeared viable and healthy. Validation of these controls lends credibility to the following results.

Cells on plates containing UHMW-PE films of Example 1 and phosphonylated UHMW-PE films of Example 3 responded much like the negative control. In both cases, cells grew next to and even beneath the material samples. The cells spread out and appeared healthy. Few cells on these plates took in trypan blue.

Cells exposed to the polyaniline control film of Comparative Example 5 indicated a negative response. In some areas about the material's perimeter, a two cell width zone of inhibition was present. Balled up cells were present in this zone. Outside this zone, cells appeared healthy and did not take in trypan blue. The cellular reaction near the material may be due to the discontinuous morphology of this film type. Small masses of the loosely adhered conductive polymer could easily leach from the film and affect the cells. Cells exposed to the polyaniline bonded phosphonylated film of Example 4 responded favorably. These cells grew next to and even beneath the film. They spread out on the plate surface and did not take in trypan blue. Because the polyaniline was bound to the phosphonylated film, it did not leach from the surface and, therefore, was not available to the cells.

Cells exposed to the polypyrrole control films of Comparative Example 9 grew near the material. However, many cells in this region were not spread out and some absorbed trypan blue. Also, the cell density near the material was lower than the density throughout the plate. This could be due to the fact that the conductive polymer could leach from the film and affect the cells. Cells exposed to polypyrrole bonded phosphonylated films of Example 6 grew near the perimeter of the films but remained balled up. Outside of this small zone, the cells spread out and appeared healthy. None of the cells on these plates took in trypan blue.

EXAMPLE 18

Formation of Polypyrrole onto Phosphonylated Yarns

Five samples were cut from a polypropylene yarn composed of 40 fibers having an average diameter of 35 microns each. The samples were suspended in a two liter reaction vessel which contained 1.5 ml of $PCl_3$ and a magnetic stir bar. The vessel was evacuated, filled with oxygen, and equilibrated to atmospheric pressure. The gas was mixed for two hours at room temperature on a Corning laboratory stirrer/hot plate Model PC-320. The samples were then removed from the vessel and sonicated in deionized water for thirty minutes. They were rinsed twice with deionized water and dried in a vacuum over at 30° C. for one hour.

Polypyrrole was deposited on the yarns, using an in-situ polymerization technique. Each yarn sample was submerged in an aqueous solution of 0.30% (w/v) ferric chloride, 0.001M naphthalene disulfonic acid, and 0.005M pyrrole. The samples were soaked in this solution for two hours at room temperature. They were then removed from the solution, rinsed once in deionized water, and dried in a vacuum oven at 30° C. for one hour. After the yarns were dried, the resistance of each sample was measured using a Fluke 8040A multimeter. The probe tips of the multimeter were placed two cm apart along the length of the yarn. In Table V below, the phosphonylated samples of the present Example are labelled 18.1–18.5 These measurements were recorded as $R_1$. The yarns were then sonicated in deionized water for one hour, rinsed twice with fresh deionized water, and dried in a vacuum oven at 30° C. for five hours. The samples of the present Example retained the conductive layer after sonication. The resistance of each yarn sample was measured again and recorded as $R_2$, below.

COMPARATIVE EXAMPLE 19

Formation of Polypyrrole onto Non-Phosphonylated Yarns

Five samples were cut from a polypropylene yarn composed of 40 fibers having an average diameter of 35 microns. The samples were sonicated in deionized water for thirty minutes and rinsed twice in fresh deionized water. They were then placed in a vacuum oven to dry at 30° C. for one hour.

Polypyrrole was deposited on the yarns, using an in-situ polymerization technique. Each yarn sample was submerged in an aqueous solution of 0.30% (w/v) ferric chloride, 0.001M naphthalene disulfonic acid, and 0.005M pyrrole. The samples were soaked in this solution for two hours at room temperature. They were then removed from the solution, rinsed once in deionized water, and dried in a vacuum oven at 30° C. for one hour. After the yarns were dried, the resistance of each sample was measured using a Fluke 8040A multimeter. The probe tips of the multimeter were placed two cm apart along the length of the yarn. In Table V, below, the non-phosphonylated samples of the present Comparative Example are labelled 19.1–19.5. These first measurements were recorded in Table V as $R_1$. The yarns were then sonicated in deionized water for one hour, rinsed twice with fresh deionized water, and dried in a vacuum oven at 30° C. for five hours. After sonication the fibers of the present Comparative Example lost all of the polypyrrole from their surfaces. The resistance of each yarn sample was measured again and recorded as $R_2$.

EXAMPLE 20

Resistivity Measurements

Resistivity measurements for the yarns of Example 18 and Comparative Example 19 are set forth in Table V, below. All measurements are in kilo-Ohms. An asterisk (*) indicates that the resistance was too great for the multimeter to read and that the sample is not conductive.

TABLE V

| Sample | $R_1$ | $R_2$ |
|---|---|---|
| 18.1 | 10.5 | 9.44 |
| 18.2 | 8.29 | 11.4 |
| 18.3 | 6.60 | 7.91 |
| 18.4 | 10.3 | 14.8 |
| 18.5 | 9.80 | 8.15 |
| 19.1 | 10.7 | * |
| 19.2 | 10.5 | * |
| 19.3 | 11.1 | * |
| 19.4 | 7.72 | * |
| 19.5 | 9.08 | * |

EXAMPLE 21

Deposition of Gold onto Phosphonylated Polyethylene Film

A polyethylene film phosphonylated in accordance with the method of Example 3 was deposited with a layer of gold by a vacuum evaporation process. The prepared sample was suspended in a vacuum chamber. The chamber contained two filaments, one of gold, the other of tungsten electroplated with chromium. The system was closed and evacuated to $1 \times 10^{-6}$ Torr. An electrical current was applied to the tungsten filament, heating the chromium. The heat sublimed the chromium, which was then deposited onto the sample. The current was turned off to the tungsten filament and electrical current was supplied to the gold filament. The filament was heated until it melted and gold was evaporated onto the sample. The process was conducted without breaking the vacuum to insure that an oxide layer did not form between the chromium and the gold layers. The gold was deposited in stripes on the film spaced at a distance of about 1 cm. The conductive surface displayed an average resistance of 115 Ohms. The gold layer could not be removed by sonication or after placement and removal of an adhesive tape on the surface. When repeated with non-phosphonylated films, the gold was partially removed by sonication and almost completely removed by the adhesive tape.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An electrically conductive article comprising:

a polymeric substrate having acid-forming functional groups covalently bonded thereto; and a coherent, uniform outer layer of an electrically conductive material wherein said electrically conductive material is molecularly bonded to said acid-forming functional groups.

2. The article set forth in claim 1 wherein said electrically conductive material is a metal.

3. The article set forth in claim 1 wherein said electrically conductive article is a surgical device.

4. The article set forth in claim 1 wherein said electrically conductive article is a lead for activation of biological processes.

5. The article set forth in claim 1 wherein said electrically conductive article is a heat transfer control device.

6. The article set forth in claim 1 wherein said electrically conductive material is an electrically conductive organic polymer selected from a pyrrole polymer, an aniline polymer, and a thiophene polymer.

* * * * *